United States Patent
Charns et al.

(10) Patent No.: US 8,497,210 B2
(45) Date of Patent: Jul. 30, 2013

(54) SHALLOW TRENCH ISOLATION CHEMICAL MECHANICAL PLANARIZATION

(75) Inventors: Leslie Charns, San Jose, CA (US); Jason E. Cummings, Smithfield, NC (US); Lukasz J. Hupka, Croton-on-Hudson, NY (US); Dinesh R. Koli, Tarrytown, NY (US); Tomohisa Konno, Mei (JP); Mahadevaiyer Krishnan, Hopewell Junction, NY (US); Michael F. Lofaro, Danbury, CT (US); Jakub W. Nalaskowski, Yorktown Heights, NY (US); Masahiro Noda, Mei (JP); Dinesh K. Penigalapati, Tarrytown, NY (US); Tatsuya Yamanaka, Mie (JP)

(73) Assignees: International Business Machines Corporation, Armonk, NY (US); JRS Corporation, Tokyo (JP)

( * ) Notice: Subject to any disclaimer, the term of this patent is extended or adjusted under 35 U.S.C. 154(b) by 137 days.

(21) Appl. No.: 13/012,142

(22) Filed: Jan. 24, 2011

(65) Prior Publication Data
US 2012/0083122 A1 Apr. 5, 2012

Related U.S. Application Data

(60) Provisional application No. 61/389,546, filed on Oct. 4, 2010.

(51) Int. Cl.
*H01L 21/302* (2006.01)
(52) U.S. Cl.
USPC .......... 438/693; 438/689; 438/690; 438/691; 216/37; 216/67

(58) Field of Classification Search
USPC ................ 438/689–693; 216/37, 67
See application file for complete search history.

(56) References Cited

U.S. PATENT DOCUMENTS

| 4,954,459 | A | 9/1990 | Avanzino et al. |
| 4,962,064 | A | 10/1990 | Haskell et al. |

(Continued)

FOREIGN PATENT DOCUMENTS

| EP | 0853335 A2 | 7/1998 |
| KR | 20030013146 A | 2/2003 |

(Continued)

OTHER PUBLICATIONS

Patent Coopertation Treaty, "The International Search Report and the Written Opinion" Issued for International Patent Application No. PCT/US2011/053230. Apr. 30, 2012. (9 Pages).

(Continued)

*Primary Examiner* — Lan Vinh
*Assistant Examiner* — Maki Angadi
(74) *Attorney, Agent, or Firm* — Tutunjian & Bitetto, P.C.; Catherine Ivers

(57) ABSTRACT

A polishing method includes polishing, in a first polish, a wafer to remove overburden and planarize a top layer leaving a portion remaining on an underlying layer. A second polishing step includes two phases. In a first phase, the top layer is removed and the underlying layer is exposed, with a top layer to underlying layer selectivity of between about 1:1 to about 2:1 to provide a planar topography. In a second phase, residual portions of the top layer are removed from a top of the underlying layer to ensure complete exposure of an underlying layer surface.

25 Claims, 4 Drawing Sheets

U.S. PATENT DOCUMENTS

| | | | |
|---|---|---|---|
| 5,173,439 | A | 12/1992 | Dash et al. |
| 5,675,587 | A | 10/1997 | Okuyama et al. |
| 5,676,587 | A | 10/1997 | Landers et al. |
| 5,712,185 | A | 1/1998 | Tsai et al. |
| 5,736,462 | A | 4/1998 | Takahashi et al. |
| 5,738,800 | A | 4/1998 | Hosali et al. |
| 5,759,917 | A | 6/1998 | Grover et al. |
| 5,938,505 | A | 8/1999 | Morrison et al. |
| 5,961,794 | A | 10/1999 | Morita |
| 6,015,755 | A | 1/2000 | Chen et al. |
| 6,019,806 | A * | 2/2000 | Sees et al. ............ 51/308 |
| 6,114,249 | A | 9/2000 | Canaperi et al. |
| 6,117,748 | A | 9/2000 | Lou et al. |
| 6,319,836 | B1 | 11/2001 | Dunton et al. |
| 6,361,402 | B1 | 3/2002 | Canaperi et al. |
| 6,440,857 | B1 * | 8/2002 | Li et al. ............ 438/692 |
| 6,491,843 | B1 | 12/2002 | Srinivasan et al. |
| 6,544,892 | B2 | 4/2003 | Srinivasan et al. |
| 6,580,137 | B2 | 6/2003 | Parke |
| 6,616,514 | B1 | 9/2003 | Edelbach et al. |
| 6,617,251 | B1 | 9/2003 | Kamath et al. |
| 6,743,683 | B2 | 6/2004 | Barns et al. |
| 6,746,316 | B2 | 6/2004 | Chopra et al. |
| 6,756,643 | B1 | 6/2004 | Achuthan et al. |
| 6,812,076 | B1 | 11/2004 | Achuthan et al. |
| 6,824,579 | B2 | 11/2004 | Ronay |
| 6,855,607 | B2 | 2/2005 | Achuthan et al. |
| 6,964,923 | B1 | 11/2005 | Ronay |
| 6,982,464 | B2 | 1/2006 | Achuthan et al. |
| 7,029,509 | B2 | 4/2006 | Kim et al. |
| 7,071,105 | B2 | 7/2006 | Carter et al. |
| 7,091,164 | B2 | 8/2006 | Srinivasan et al. |
| 7,125,321 | B2 | 10/2006 | Prince et al. |
| 7,125,776 | B2 | 10/2006 | Achuthan et al. |
| 7,166,506 | B2 | 1/2007 | Prince et al. |
| 7,217,989 | B2 | 5/2007 | Hiramitsu et al. |
| 7,271,088 | B2 | 9/2007 | Jung et al. |
| 7,294,575 | B2 * | 11/2007 | Hsu et al. ............ 438/692 |
| 7,531,105 | B2 | 5/2009 | Dysard et al. |
| 8,058,175 | B2 | 11/2011 | Huang et al. |
| 2004/0266115 | A1 | 12/2004 | Chan et al. |
| 2006/0216935 | A1 * | 9/2006 | Oswald et al. ............ 438/691 |
| 2007/0190771 | A1 | 8/2007 | Bailey, III et al. |
| 2008/0045014 | A1 | 2/2008 | Chen et al. |
| 2008/0305610 | A1 | 12/2008 | Chen et al. |
| 2009/0057769 | A1 | 3/2009 | Wei et al. |
| 2009/0087974 | A1 | 4/2009 | Waite et al. |
| 2010/0048007 | A1 | 2/2010 | Lee et al. |
| 2010/0059823 | A1 | 3/2010 | Chung et al. |
| 2010/0062577 | A1 | 3/2010 | Liao et al. |
| 2010/0144149 | A1 * | 6/2010 | Ward et al. ............ 438/693 |
| 2011/0227167 | A1 | 9/2011 | Chuang et al. |
| 2012/0068347 | A1 | 3/2012 | Isobayashi et al. |

FOREIGN PATENT DOCUMENTS

| | | |
|---|---|---|
| KR | 20080084293 A | 9/2008 |
| KR | 20080101454 A | 11/2008 |
| KR | 20090026984 A | 3/2009 |
| KR | 20090038141 A | 4/2009 |

OTHER PUBLICATIONS

America, W., et al. "Slurry Additive Effects on the Suppression of Silicon Nitride Removal During CMP" Electrochemical and Solid-State Letters, vol. 7, Issue 12. Nov. 2004. pp. 327-330.

Arnaud, F., et al. "32nm General Purpose Bulk CMOS Technology for High Performance Applications at Low Voltage" IEDM Technical Digest, Dec. 2008. pp. 633-636.

Auth, C., et al. "45nm High-k+Metal Gate Strain-Enhanced Transistors" 2008 Symposium on VLSI Technology Digest of Technical Papers. 2008. pp. 128-129.

Blumenstock, K., et al. "Shallow Trench Isloation for Ultra-Large-Scale Integrated Devices" J. Vac. Sci. Technol. B 12(1). Jan.-Feb. 1994. pp. 54-58.

Boning, D., et al. "Nanotopography Issues in Shallow Trench Isolation CMP" Material Research Society (MRS) Bulletin. Oct. 2002. pp. 761-765.

Boyd, J., et al. "A One-Step Shallow Trench Global Planarization Process Using Chemical Mechanical Polishing" Journal of the Electrochemical Society, vol. 144, No. 5. May 1997. pp. 1838-1841.

Bu, K., et al. "Selective Chemical Mechanical Polishing Using Surfactants" Journal of the Electrochemical Society, vol. 154, Issue 7. May 2007. pp. 631-635.

Chau, R. "Advanced Metal Gate/High-K Dielectric Stacks for High-Performance CMOS Transistors" Proceedings of the American Vacuum Society 5th International Conference on Microelectronics and Interfaces (ICMI). Mar. 2004. (3 Pages).

Chau, R., et al. "30nm Physical Gate Length CMOS Transistors With 1.0 ps n-MOS and 1.7 ps p-MOS Gate Delays" 2000 International Electron Devices Meeting, Dec. 2000. pp. 45-48.

Chau, R., et al. "High-K/Metal-Gate Stack and Its MOSFET Characteristics" IEEE Electron Device Letters, vol. 25, No. 6. Jun. 2004. pp. 408-410.

Choi, J., et al. "Chip Scale Prediction of Nitride Erosion in High Selectivity STI CMP" Proceedings of 2006 CMP-MIC. Feb. 2006. (10 Pages).

Choi, J., et al. "Chip Scale Topography Evolution Model for CMP Process Optimization" Proc. 2005 IEEE International Symposium on Semiconductor Manufacturing, IEEE. Sep. 2005. (6 Pages).

Choi, K., et al. "Extremely Scaled Gate-First High-k/Metal Gate Stack With EOT of 0.55 nm Using Novel Interfacial Layer Scavenging Techniques for 22nm Technology Node and Beyond" 2009 Symposium on VLSI Technology Digest of Technical Papers. Jun. 2009. pp. 138-139.

Colinge, J. "FinFETs and Other Multi-Gate Transistors" Integrated Circuits and Systems. Nov. 2007. (5 Pages).

Cummings, J., et al. "A Comparative Study of Ceria-Based and Silica-Based Slurries for 32NM Shallow Trench Isolation Chemical Mechanical Planarization" Thirteenth International C.M.P. Planarization for ULSI Multilevel Interconnection Conference. Mar. 2008. (8 Pages).

Davari, B., et al. "A New Planarization Technique, Using a Combination of RIE and Chemical Mechanical Polish (CMP)" Electron Devices Meeting, 1989. IEDM '89. Technical Digest., International. Dec. 1989. pp. 61-64.

Haensch, W., et al. "Silicon CMOS Devices Beyond Scaling" IBM Journal of Research and Development, vol. 50, No. 4/5. Jul.-Sep. 2006. pp. 339-361A.

Harris, H., et al. "Band-Engineered Low PMOS VT With High-K/Metal Gates Featured in a Dual Channel CMOS Integration Scheme" 2007 Symposium on VLSI Technology Digest of Technical Papers. Jun. 2007. pp. 154-155.

Ishihara, T., et al. "Universal Mobility Modeling and Its Application to Interface Engineering for Highly Scaled MOSFETs Based on First-Principles Calculation" 2009 IEEE. International Electron Devices Meeting, IEDM '09. Dec. 2009. pp. 75-78.

Kahng, A., et al. "Fill for Shallow Trench Isolation CMP" 2006 International Conference on ComputerAided Design (ICCAD'06). Nov. 2006. (8 Pages).

Kaneko, A., et al. "Sidewall Transfer Process and Selective Gate Sidewall Spacer Formation Technology for Sub-15nm FinFET With Elevated Source/Drain Extension" IEEE International Electron Devices Meeting (IEDM 2005). Dec. 2005. (4 Pages).

Kotlyar, R., et al. "Inversion Mobility and Gate Leakage in High-k/Metal Gate MOSFETs" IEEE International Electron Devices Meeting (IEDM 2004). Dec. 2004. pp. 391-394.

Lai, C., et al. "A Novel 'Hybrid' High-k/Metal Gate Process for 28nm High Performance CMOSFETs" IEEE International Electron Devices Meeting (IEDM 2009). Dec. 2009. pp. 655-658.

Lee, B. "Modeling of Chemical Mechanical Polishing for Shallow Trench Isolation" Massachusetts Institute of Technology: Department of Electrical Engineering and Computer Science. Thesis Paper. May 2002. (201 Pages).

Lee, B., et al. "Using Smart Dummy Fill and Selective Reverse Etchback for Pattern Density Equalization" Proc. CMP-MIC. Feb.-Mar. 2000. pp. 255-258.

Mistry, K., et al. "A 45nm Logic Technology With High-k+Metal Gate Transistors, Strained Silicon, 9 Cu Interconnect Layers, 193 nm Dry Patterning, and 100% Pb-Free Packaging" IEEE International Electron Devices Meeting (IEDM 2007). Dec. 2007. (4 Pages).

Pan, J., et al. "Planarization and Integration of Shallow Trench Isolation" 1998 VMIC. VLSI Multilevel Interconnect Conference. Jun. 1998. pp. 1-6.

Prasad, Y., et al. "Role of Amino-Acid Adsorption on Silica and Silicon Nitride Surfaces During STI CMP" Electrochemical and Solid-State Letters, vol. 9, Issue 12. Sep. 2006. pp. 337-339.

Ranade, R., et al. "High Performance 35nm LGATE CMOS Transistors Featuring NiSi Metal Gate (FUSI), Uniaxial Strained Silicon Channels and 1.2nm Gate Oxide" IEEE International Electron Devices Meeting (IEDM 2005). Dec. 2005. (4 Pages).

Romer, A., et al. "STI CMP Using Fixed Abrasive Demands, Measurement Methods and Results" CMP-MIC, Mar. 2000. (10 Pages).

Schlueter, J. "Trench Warfare: CMP and Shallow Trench Isolation" Semiconductor International. Oct. 1999. (5 Pages).

Steigerwald, J. "Chemical Mechanical Polish: The Enabling Technology" IEEE International Electron Devices Meeting (IEDM 2008). Dec. 2008. pp. 37-39.

Takahashi, H., et al. "Interaction Between Ultrafine Ceria Particles and Glycine" Journal of Ceramic Processing Research. vol. 5, No. 1. 2004. pp. 25-29.

Tomimatsu, T., et al. "Cost Effective 28-nm LSTP CMOS Using Gate-First Metal Gate/High-k Technology" 2009 Symposium on VLSI Technology Digest for Technical Papers. Jun. 2009. pp. 36-37.

Veera, R., et al. "Selective Chemical Mechanical Polishing of Silicon Dioxide Over Silicon Nitride for Shallow Trench Isolation Using Ceria Slurries" Journal of The Electrochemical Society. vol. 156, Issue 12. Oct. 2009. pp. 936-943.

Vo, T., et al. "Improved Planarization for STI With Fixed Abrasive Technology" Solid State Technology. Jun. 2000. (7 Pages).

Xie, X., et al. "Integrated Modeling of Nanotopography Impact in Patterned STI CMP" Microsystems Technology Laboratories. ULSI Multilevel Interconnect Conference. Feb. 2003. pp. 1-23. http://www-mtl.mit.edu/researchgroups/Metrology/PAPERS/CMPMIC-nanomodel-talk-feb2003.pdf.

* cited by examiner

SHALLOW TRENCH ISOLATION CHEMICAL MECHANICAL PLANARIZATION

RELATED APPLICATION INFORMATION

This application claims priority to U.S. Provisional Ser. No. 61/389,546 filed on Oct. 4, 2010, incorporated herein by reference in its entirety.

This application is related to commonly assigned applications: "CHEMICAL MECHANICAL PLANARIZATION WITH OVERBURDEN MASK", Ser. No. 13/012,821 filed concurrently herewith; "CHEMICAL MECHANICAL PLANARIZATION PROCESSES FOR FABRICATION OF FIN-FET DEVICES", Ser. No. 13/012,836 filed concurrently herewith; and "FABRICATION OF REPLACEMENT METAL GATE DEVICES", Ser. No. 13/012,879 filed concurrently herewith, all incorporated herein by reference.

TECHNICAL FIELD

The present invention relates to semiconductor fabrication and devices and more particularly to systems and methods for chemical mechanical planarization (CMP).

RELATED ART

Shallow trench isolation (STI) structures were introduced at the 0.25 μm technology node to replace traditional LOCOS (local oxidation of silicon) structures to provide better device isolation. An STI fabrication process involves chemical mechanical planarization (CMP) steps. Shallow trench isolation CMP is one of the applications of the front-end-of-the-line (FEOL) CMP processes and presents several technical and manufacturability challenges. The primary factors that influence the STI CMP process are i) pattern density variations across the chip, ii) trench etch process variability affecting the wall slope and oxide fill, and iii) the type of silicon dioxide hereinafter called "oxide" (e.g., tetraethyl orthosilicate (TEOS), high density plasma (HDP) oxides, high-aspect-ratio process (HARP) oxides) and silicon nitride hereinafter called "nitride" (e.g., plasma enhance chemical vapor deposition (PECVD), low pressure chemical vapor deposition (LPCVD), rapid thermal chemical vapor deposition (RTCVD)) used. The variations in the thickness and uniformity of the oxide and nitride deposits across the wafer are also factors that affect the STI CMP.

In turn, subsequent process steps are affected by the CMP process. It is beneficial to completely remove all the oxide on top of the nitride. Otherwise, the remaining oxide acts as a mask during nitride strip leaving residual nitride. To ensure complete removal of oxide on top of nitride, a dilute buffered HF etch may be used. However, this increases the trench oxide loss and amplifies scratch defects. The final topography is significantly affected by both the CMP process as well as the post CMP wet etch processes.

Dishing, erosion and pattern density dependant nitride thickness are some of the contributing factors to the non-planarity in the STI CMP process. However, even if the STI CMP process achieves perfect planarity and perfectly uniform post CMP nitride thickness across all pattern densities, removal of the sacrificial nitride will result in a non-planar surface. Since both polish rates and wet etch rates are pattern density dependant, non-uniformities accumulate from all sources, resulting in large topography variations.

The pattern density effect significantly affects the post CMP planarity. Due to the close similarity of the oxide dielectric material used in an interlevel dielectric (ILD) polish, early STI CMP processes employed the same consumables (pads, slurries) and process parameters used for ILD CMP. Since all the oxide over the nitride should be removed in very large active areas as well as highly dense arrays, a certain amount of over-polishing is needed. This results in the removal of the entire nitride layer in some features and erosion of trench oxide in other areas. This is attributed to the high polish rate of nitride (~300 Å/min) in typical conventional oxide slurries.

SUMMARY

A method for polishing a wafer includes, in a first polish step, removing overburden and planarizing a top layer leaving a portion remaining on an underlying layer. A second polish step includes two phases. In a first phase, the top layer is removed and the underlying layer is exposed with a top layer to underlying layer selectivity of between about 1:1 to about 2:1 to provide a planar topography. In a second phase, residual portions of the top layer are removed from a top of the underlying layer to ensure complete exposure of an underlying layer surface.

A method for polishing shallow trench isolation (STI) structures to planarize oxide layers and expose underlying nitride includes a first chemical mechanical polish step to remove overburden and planarize an oxide layer leaving 300 to 600 Å of oxide remaining; a second chemical mechanical polish step including two phases having: a first phase including removing of the oxide layer to expose underlying nitride surfaces with an oxide to nitride selectivity of about 1:1 to 2:1 to provide a planar topography; and a second phase including removing residual oxide that remains on top of the nitride surface to ensure complete exposure of the nitride surface.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
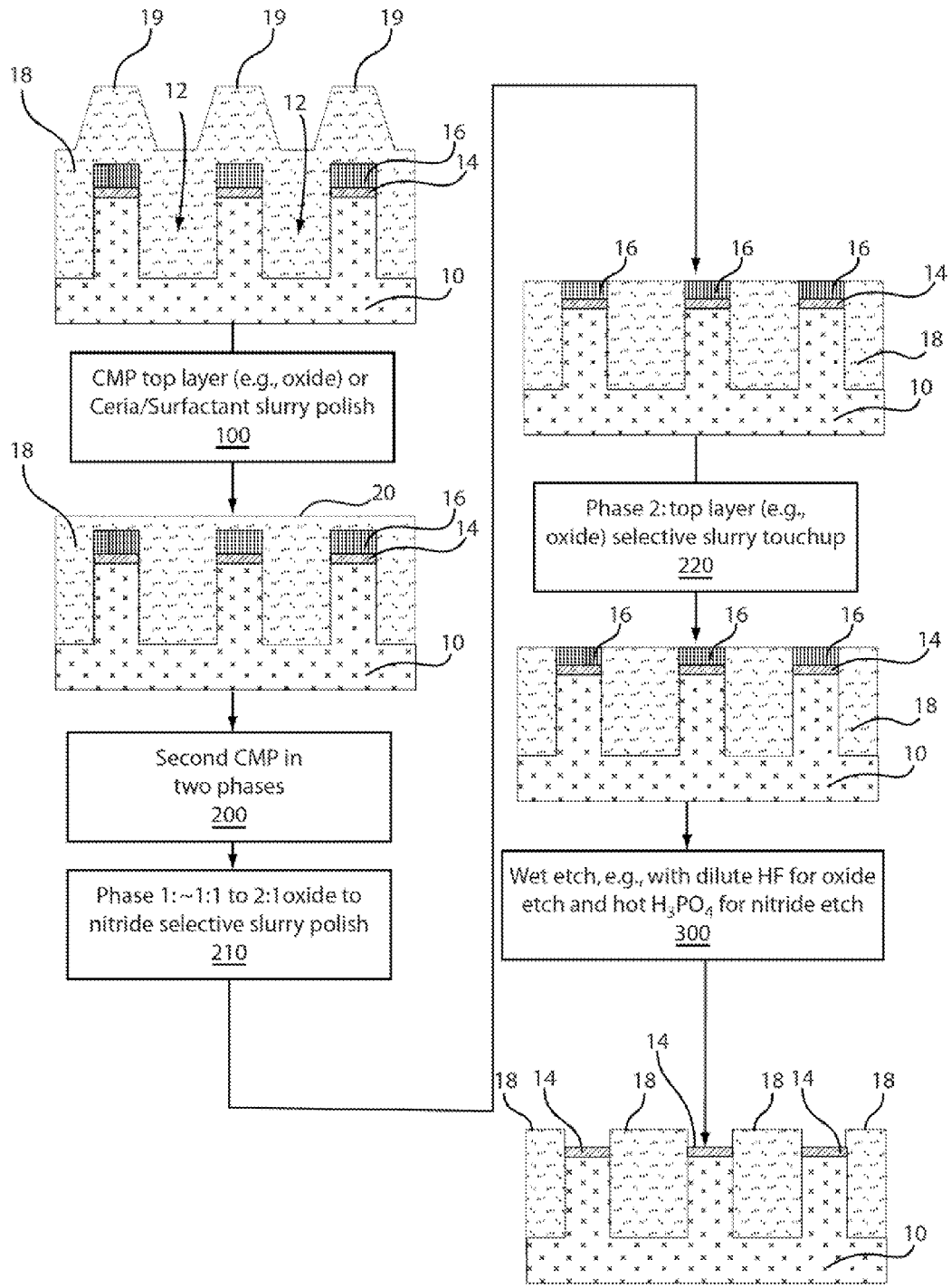
FIG. 1 is a schematic diagram showing cross-sectional views of a semiconductor device and process steps to illustrate a two step shallow trench isolation (STI) chemical mechanical planarization (CMP) process in accordance with the present principles.

Methods for chemical mechanical planarization of semiconductor device structures are provided. In one particularly useful embodiment, the semiconductor device structures include a shallow trench isolation structure. The methods employ a series of steps involving slurries with different selectivity towards different dielectric materials. Dielectric materials may include layers of oxide and nitride, although other materials may be employed which can be etched selectively relative to one another.

In one method, a first step involves polishing with a colloidal silica slurry or ceria/surfactant slurry to reduce the overburden and planarize an initial topography, leaving a thin layer, e.g., about 300 to 600 Å of oxide. A next step includes two phases. In phase one, slurry with selectivity between a top layer and an underlying layer is used to polish off the top layer and expose the underlying layer. In one embodiment, selectivity may include approximately 1:1 to 2:1 oxide (top layer) to nitride (underlying layer). In phase two, slurry with a high top layer polish rate and no significant underlying layer rate is used to remove any residual top layer material that remains on top of the underlying layer. This ensures complete exposure of the entire underlying layer so that the underlying layer can be removed by a wet etch in subsequent processing.

The present principles achieve highly planar post chemical mechanical planarization (CMP) surfaces by employing slurries with different selectivity between layers, e.g., oxide and nitride. In a process using oxide and nitride, excess oxide overburden is removed, with, e.g., ~300 Å of oxide remaining after polish. For this planarization step, an oxide polish slurry with, e.g., a 4:1 oxide to nitride selectivity or ceria/surfactant based slurry can be used. In a next step, slurry with approximately 1:1 oxide to nitride selectivity may be used to achieve equal polish rates for oxide and nitride areas to avoid dishing and erosion due to differences in the polish rates of the two materials. To ensure that no oxide is left on top of nitride, an additional touch up polish with a high oxide rate and negligible nitride rate can be used as an option. This prevents any loss of nitride while removing trace amounts of oxide during the touch up polish. This can be accomplished by changing the composition of the slurry used.

The flowchart and block diagrams in the Figures may, in some alternative implementations, occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of given illustrative architectures; however, other architectures, structures, substrate materials and process features and steps may be varied within the scope of the present invention. Throughout this disclosure oxide, nitride and polysilicon materials are described. However, these materials are illustrative and other materials are also contemplated and within the scope of the invention. In addition, thickness dimensions are described throughout this disclosure. These thickness dimensions are illustrative and other dimensions may be employed in accordance with the present principles.

Devices as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, cross-sectional views of a CMP process are shown in accordance with one illustrative embodiment. One advantage of this process is that it provides the flexibility of using slurries with different selectivity to achieve highly planar post polish topography. This process uses slurries that are capable of providing different polish rates for a top layer and an underlying layer which can be varied to achieve highly planar post polish surfaces.

For purposes of explanation, a top layer of oxide and an underlying layer of nitride will be described. These materials represent a commonly employed pair of materials and are particularly useful in shallow trench isolation fabrication processes. Other materials and pairs of materials may also be employed. Slurry compositions for an STI CMP process will also be illustratively described.

Initially, a semiconductor substrate 10 has trenches 12 formed therein to be employed in forming shallow trench isolation. The trenches 12 are etched into substrate 10 by forming and patterning a lithography mask and additional layers which may include a pad oxide 14 and a pad nitride 16. An oxide 18 (e.g., TEOS, HDP oxides, HARP) is deposited in the trenches 12 and over the pad nitride 16. It should be understood that other structures may be employed.

In a step 100, oxide overburden 19 is removed by polishing. One goal of this step is to reduce a large initial topography while removing a bulk of the oxide overburden and leaving a planar oxide layer 20 of approximately 300 Å-600 Å everywhere on the device (e.g., semiconductor die), closer to 300 Å is preferable. Since a high oxide removal rate is desired and virtually no nitride surfaces are exposed during the initial stages of polish, the slurry selectivity is of less concern in step 100. This can be achieved by oxide polish slurries with approximately 4:1 oxide to nitride selectivity. The oxide slurries may include alkaline, such as, potassium hydroxide or ammonium hydroxide and silica abrasive which may be selected from fumed silica and colloidal silica. However, to improve the planarity and achieve uniform oxide thickness across various pattern densities, it may be desirable to incorporate additives to the oxide slurries. Ceria/surfactant systems can also be used in step 100 to achieve the desired planarity and uniformity.

In step 200, a planarization polish is performed. Step 200 removes the remaining ~300 Å of the oxide layer 18, exposes the underlying nitride covered surfaces (pad nitride 16) and achieves a highly planar final surface that is free of defects such as polish scratches, pits and other blemishes. To achieve high planarity, it is preferable to have approximately the same polish rates for oxide and nitride covered surfaces. The polish rates of oxide and nitride should not be very high since this inevitably will lead to poor controllability. Thus, it would be highly desirable to have a slurry that has polish rates in the range of about 300 to about 600 Å/min for oxide and nitride. This will provide appropriate polish times with good controllability and allow over-polish margins to planarize hard to polish structures.

Chemical mechanical planarization polish rates of different materials vary with line width, pattern density and feature size in an actual circuit layout. Local polish rates of different materials in patterned structures are very complex functions of the polish rates of the same materials in blanket wafers. Thus, it may be advantageous to optimize the slurry selectivity by polishing patterned wafers and measuring the planarity experimentally to ensure that the desired goals are achieved. Since die layouts vary between technology nodes and even among different products in the same technology node, it is highly desirable to be able to change the polish rate selectivity by varying the concentrations of the components in the slurry. Polish rate selectivity is "tunable" in step 200 within a range for the slurry system to be usable across a wide range of products and technology nodes. The ability to tune the polish rate selectivity is a factor in the polish step 200 in achieving highly planar final surface using the present scheme.

The step 200 includes two phases. In phase 210, one goal is to achieve a highly planar surface. This can be accomplished with oxide to nitride selectivity of, e.g., approximately 1:1 to approximately 2:1. In some areas that are covered with nitride, a thin layer oxide may remain on top of the nitride, and these areas may need further polishing (over-polish) to remove the oxide and completely expose the nitride. If the over-polish is done with a 1:1 to 2:1 selectivity slurry, excess removal of nitride can occur. Thus, one goal of a phase two polish 220 (which is optional) is to ensure that no significant loss of nitride occurs during the removal of residual oxide on top of nitride. This employs a slurry with a high oxide polish rate and no significant nitride polish rate.

The present principles provide slurry compositions that provide the oxide to nitride selectivity of approximately 1:1 to 2:1 for the phase one polish 210 and a much higher oxide to nitride selectivity for phase two 220. In one embodiment, two different slurry compositions are used during phase one 210 and phase two 220. In another embodiment, a two component slurry system is provided where both components are used for the phase one polish 210 and only one component of the slurry system is used during the phase two 220. In yet another embodiment, only one component is used during phase one 210 and both components are used during phase two 220.

In step 300, additional etching may be performed to clean up surfaces in preparation of additional processing. The etch may include an HF etch, or a dilute HF etch for oxide removal and a hot phosphoric acid ($H_3PO_4$) wet etch for nitride removal. Nitride 16 is shown in FIG. 1 as removed from oxide 14 after step 300.

The slurry according to one embodiment may include the following components: a) Abrasive, b) pH modulator, and c) Organic acid.

a) Abrasive: The abrasive may be at least one type of abrasive selected from inorganic particles and organic particles. Examples of the inorganic particles may include silica, alumina, titania, zirconia, ceria, and the like. Examples of the silica may include fumed silica, silica synthesized by a sol-gel method, colloidal silica, and the like. The fumed silica may be obtained by reacting silicon chloride or the like with oxygen and water in a gaseous phase. The silica synthesized by the sol-gel method may be obtained by hydrolysis and/or condensation of an alkoxysilicon compound as a raw material. The colloidal silica may be obtained by an inorganic colloid method using a raw material purified in advance, for example. Examples of the organic particles may include polyvinyl chloride, a styrene (co)polymer, polyacetal, polyester, polyamide, polycarbonate, an olefin (co)polymer, a phenoxy resin, an acrylic (co)polymer, and the like. Examples of the olefin (co)polymer may include polyethylene, polypropylene, poly-1-butene, poly-4-methyl-1-pentene, and the like. Examples of the acrylic (co)polymer may include polymethyl methacrylate and the like. An average particle diameter of the abrasive is preferably 5 to 500 nm, more preferably 10 to 200 nm, and still more preferably 20 to 150 nm. An appropriate polishing rate can be achieved using the abrasive grains having an average particle diameter within this range.

b) pH modulator: The pH of the slurry according to this embodiment is preferably 1 to 11 and more preferably 2 to 6. An appropriate polish rate can be achieved by adjusting the pH of the slurry to this range. Examples of a pH modulator may include an organic base, an inorganic base, and an inorganic acid. Examples of the organic base may include tetramethylammonium hydroxide, triethylamine, and the like. Examples of the inorganic base may include ammonium hydroxide, potassium hydroxide, sodium hydroxide, and the like. Examples of the inorganic acid may include nitric acid, sulfuric acid, phosphoric acid, and the like.

c) Organic acid: Organic acid is used as an accelerator for the nitride polish rate. Various organic acids such as monobasic acids (e.g., monocarboxylic acid), dibasic acids (e.g., dicarboxylic acid), polybasic acids (e.g., polycarboxylic acid), and carboxylic acids with substituted groups (hydroxyl, amine) can be used. Examples of such organic acids include saturated acids, unsaturated acids, aromatic acids, and the like. Examples of the saturated acids may include formic acid, acetic acid, butyric acid, oxalic acid, malonic acid, succinic acid, glutaric acid, adipic acid, and the like. Examples of the acids containing hydroxyl groups may include lactic acid, malic acid, tartaric acid, citric acid, and the like. Examples of the unsaturated acid may include maleic acid, fumaric acid, and the like. Examples of the aromatic acid may include benzoic acid, phthalic acid, and the like. It is preferable to use an organic acid having two or more carboxylic acid groups to obtain a high polish rate of nitride. The salts of these organic acids may also be employed (e.g., potassium or ammonium salts).

Other components: The present embodiments permit the addition of other ingredients into the slurry to tune the oxide to nitride selectivity. The slurry according to one embodiment may include a surfactant. Examples of surfactants may include anionic, nonionic, and cationic surfactants. Examples of anionic surfactants may include a surfactant containing at least one functional group selected from a carboxyl group (—COOX), a sulfonic acid group (—$SO_3X$), and a phosphate group (—$HPO_4X$) (wherein X represents hydrogen, ammonium, or a metal). Examples of the anionic surfactant may include aliphatic and aromatic sulfates and sulfonates, a phosphate salt, and the like. Compounds such as potassium dodecylbenzenesulfonate, ammonium dodecylbenzenesulfonate, sodium alkylnaphthalenesulphonate, alkyl sulfosuccinate, potassium alkenylsuccinate, or the like may be preferably employed. Aliphatic soaps like potassium oleate and the like may be employed. These anionic surfactants may be used either individually or in combination. Examples of the nonionic surfactant may include a polyoxyethylene alkyl ether, an ethylene oxide-propylene oxide block copolymer, acetylene glycol, an ethylene oxide addition product of acetylene glycol, an acetylene alcohol, and the like. Note that a nonionic polymer compound such as polyvinyl alcohol, cyclodextrin, polyvinyl methyl ether, or hydroxyethylcellulose may also be used. Examples of the cationic surfactants may include an aliphatic amine salts, aliphatic ammonium salts, and the like. In addition, polyelectrolytes such as poly (acrylic acid) and their salts such as sodium, potassium and ammonium can also be added during the polishing to control the selectivity.

The present principles including the functions of the components of the slurry are further described below by way of examples. Note that the invention is not limited to the following examples. Examples 1-5 may be employed for step 100 although these materials may be employed in other steps in accordance with the present principles.

In example 1, effects of additional ammonium hydroxide to a colloidal silica abrasive (the abrasive is available commercially from, e.g., Fuso Chemical Co., Ltd., Japan) with a primary particle diameter of 35 nm provide a useful slurry in accordance with one illustrative embodiment. This colloidal silica abrasive is an example of a commercial silica abrasive which may be employed to achieve the features in accordance with the present principles. The oxide to nitride rate selectivity from 0 to 1 can be achieved with this slurry. However, the polish rates may remain very low for both oxide and nitride.

In example 2, citric acid with silica abrasives provides very high selectivity towards oxide. The oxide polish rates are in the range 450 to 600 Å/min while the nitride rates are close to 0.

In example 3, citric acid and ammonium hydroxide with silica abrasives provides oxide to nitride rate selectivity from 0 to 1. The oxide polish rates are in the range 150 to 500 Å/min while the nitride rates vary from 0 to 250 Å/min.

In example 4, phosphoric acid with silica abrasives provides an oxide to nitride rate selectivity from 0 to 1. In this case, the oxide rates vary from 400 to 650 Å/min and nitride rates vary in a narrow range of 150 to 200 Å/min. Here, the variation in selectivity is achieved by allowing the oxide rates to vary while keeping the nitride polish rates nearly constant or in a very narrow range.

In example 5, citric acid, ammonium hydroxide and phosphoric acid with silica abrasives provide an oxide to nitride rate selectivity from 0 to 0.4. The oxide polish rates are very nearly constant or in the very narrow range (450 to 470 Å/min) while the nitride rates vary from 0 to 250 Å/min. Here, the variation in selectivity is achieved by allowing the nitride rates to vary while keeping the oxide polish rates nearly constant or in a very narrow range.

In example 6, a slurry suitable for a step 210 (phase one) polish includes, for example:
1) Silica abrasives in the range of 0.5 to 30% by weight, the preferred range being 5 to 10% by weight,
2) An organic acid in the range of 0.5 to 50 g/L, the preferred range being 3 to 25 g/L
3) An acidic pH modulator in the range of 0.01 to 5 g/L, the preferred range being 0.1 to 2.0 g/L,
4) An alkaline pH modulator in the range of 0 to 5 g/L, the preferred range being 0 to 2 g/L, and
5) pH of the slurry in the range of 1 to 11, the preferred range being 2 to 6.

In example, 7, a particularly useful example of the formulation of example 6 includes:
1) 5 W % of colloidal silica abrasives dispersed in water,
2) 5 g/L of citric acid,
3) 0.25 to 0.35 g/L of phosphoric acid,
4) 0.1 to 0.5 g/L of ammonium hydroxide, and
5) pH in the range of 2-5, the preferred pH being ~4.

In example 8, another particularly useful example of the formulation of example 6 includes:
1) 10 W % of colloidal silica abrasives dispersed in water,
2) 10 g/L of citric acid,
3) 1 to 2 g/L of phosphoric acid,
4) 0.1 to 2.0 g/L of ammonium hydroxide, and
5) pH in the range of 2-5.

Figure 2:
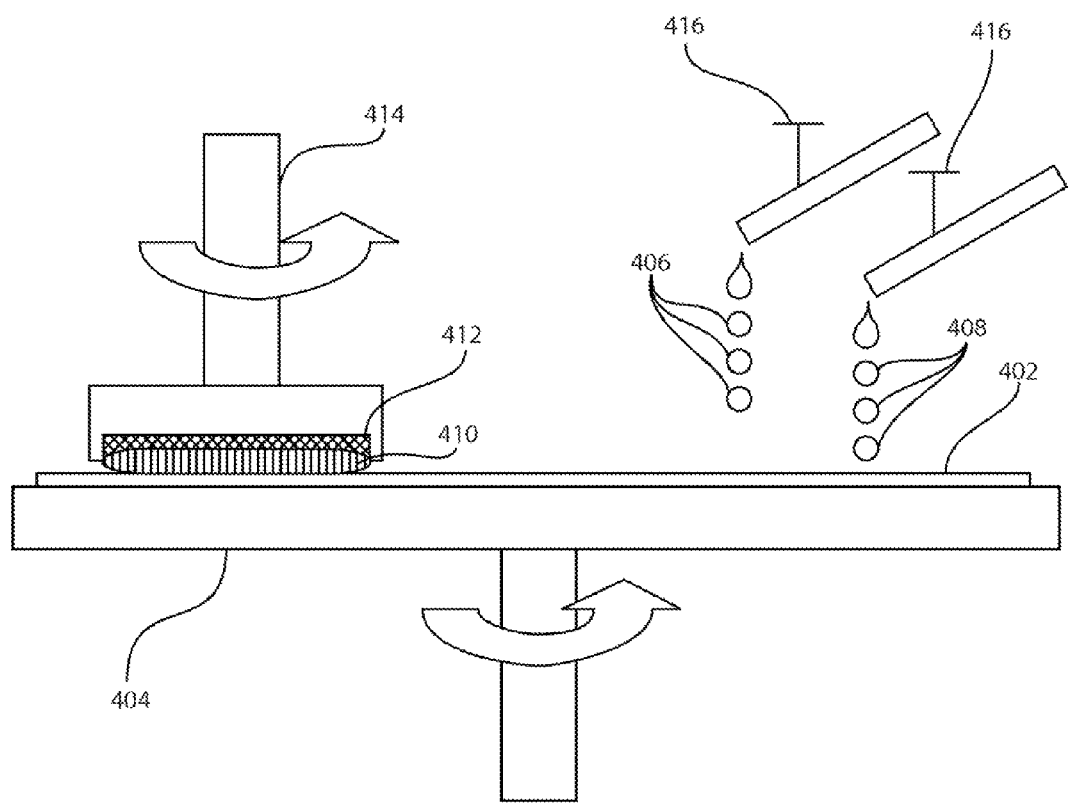
FIG. 2 is a diagram showing a two part slurry system employing a two part slurry with variable flow rates in accordance with one embodiment.

Referring to FIG. 2, in another embodiment, a polishing table 404 is illustratively shown in accordance with one illustrative embodiment. Table 404 includes a rotating pad 402 on which a semiconductor wafer 410 is polished. A wafer carrier 414 holds the wafer 410 by vacuum suction through a backing film 412. The wafer 410 is mounted in such a way that the surface to be polished is in contact with the polishing pad 402. Polishing slurry 406 (and/or 408) may include one component or multiple components. The component flow rates are controlled using schematically depicted valves 416 which are preferably automated.

In one embodiment, a slurry includes two parts: Part 1—an abrasive slurry (e.g., silica), organic acid and acidic pH modulator, Part 2—alkaline pH modulator and acidic pH modulator. The slurry can be supplied to a polishing table 404 as two components 406, 408 and allowed to mix on the polishing table to create slurry with the desired final composition. By using the same or different slurry flow rates, slurry composition can be varied during the polish to get desirable polish rates for oxide and nitride at different stages of polish. In another example, initially Part 1 and Part 2 are used and after a certain time Part 2 is switched off to create slurry with a different oxide to nitride selectivity than the original formulation. Similar effects can be achieved by keeping the flow rate of one of the components constant and varying the other as polishing progresses.

In another embodiment the slurry includes two parts: Part 1—abrasive slurry (e.g., silica), organic acid, and acidic pH modulator; Part 2—silica abrasive slurry, alkaline pH modulator and acidic pH modulator. The slurry can be supplied to the table 404 as two components 406, 408 and allowed to mix on the polishing table 404 to create slurry with the desired final composition. By using the same or different slurry flow rates, the slurry composition can be varied during the polish to get desirable polish rates for oxide and nitride at different stages of polish. Initially, Part 1 is used and after a certain time Part 1 is switched off, and Part 2 is switched on to create slurry with a different oxide to nitride selectivity than the original formulation.

In another embodiment, these slurries are used as two independent slurries for phase one and phase two polishes. Phase two slurries should have high oxide to nitride selectivity with no significant nitride polish rate. Examples of slurry compositions that have this capability are described below.

In example 9, a phase two (step 220) slurry may include:
1) 5 W % of colloidal silica abrasives dispersed in water,
2) 5 g/L of citric acid,
3) 0.25 to 0.35 g/L of phosphoric acid, and
4) pH in the range of 2-3.

In example 10, another example of a phase two (step 220) slurry includes:
1) 10 W % of colloidal silica abrasives dispersed in water,
2) 15 g/L of citric acid,
3) 0.25 to 0.35 g/L of phosphoric acid,
4) 0.5 g/L of ammonium hydroxide, and
5) pH in the range of 2-3.

Figure 3:
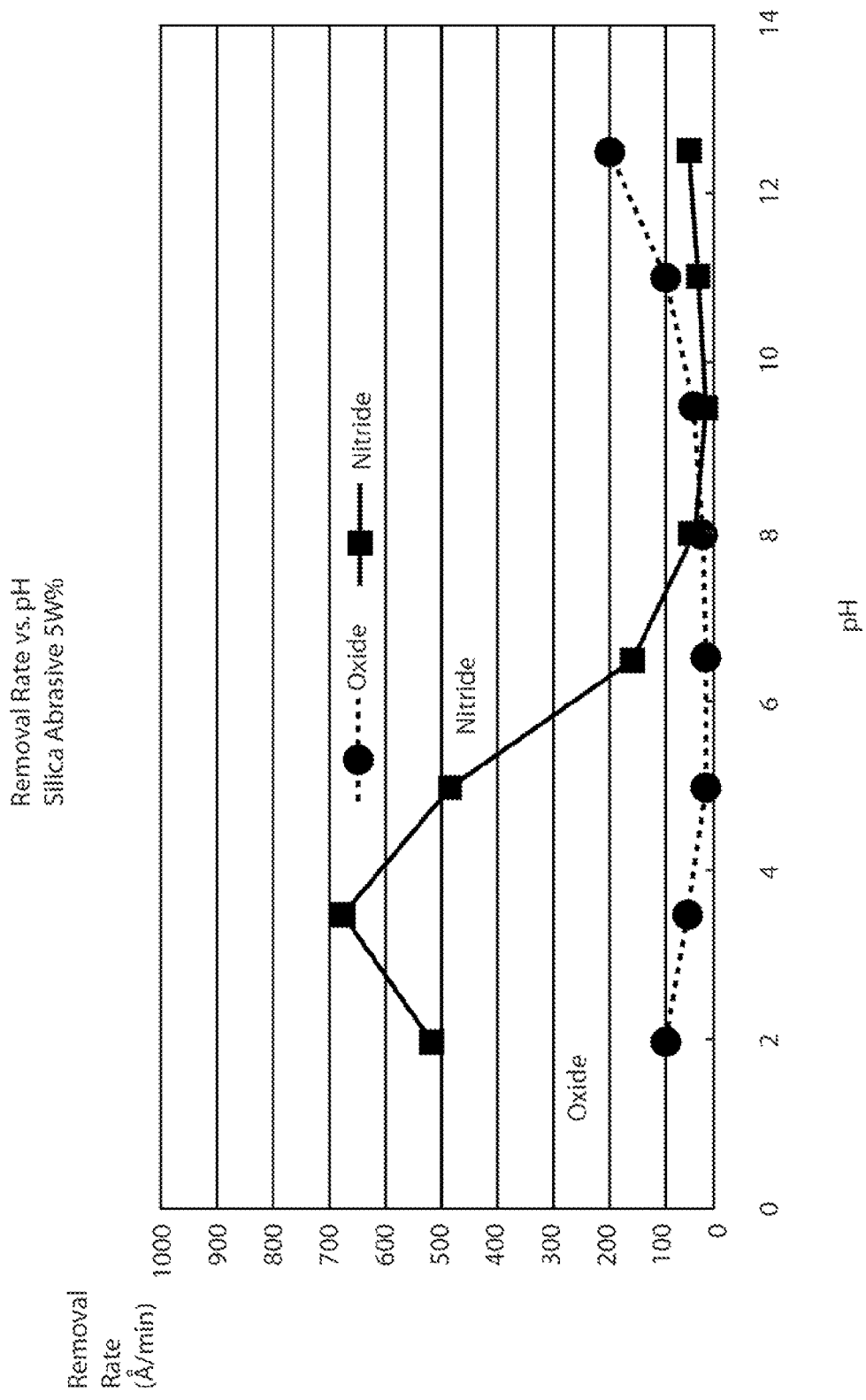
FIG. 3 is a plot showing an effect of pH on polish rates of oxide and nitride by adjusting the pH with phosphoric acid and KOH.

Referring to FIG. 3, a plot of removal rate versus pH is illustratively shown to show effects of pH on the polish rates of oxide and nitride with silica abrasives. In the pH range 2 to 7, the polish rate of nitride is about 150 to 650 Å/min. A highest value is reached at pH ~3.5. The oxide rate is significantly low in this range hovering around ~10 to 100 Å/min. In the pH range 8 to 10, both oxide and nitride rates remain low. From pH 11 to 13, the oxide rate starts to increase while nitride rate remains low. The pH values of these solutions were adjusted with phosphoric acid in the range 1 to 7 and with KOH in the range 8 to 11.

Figure 4:
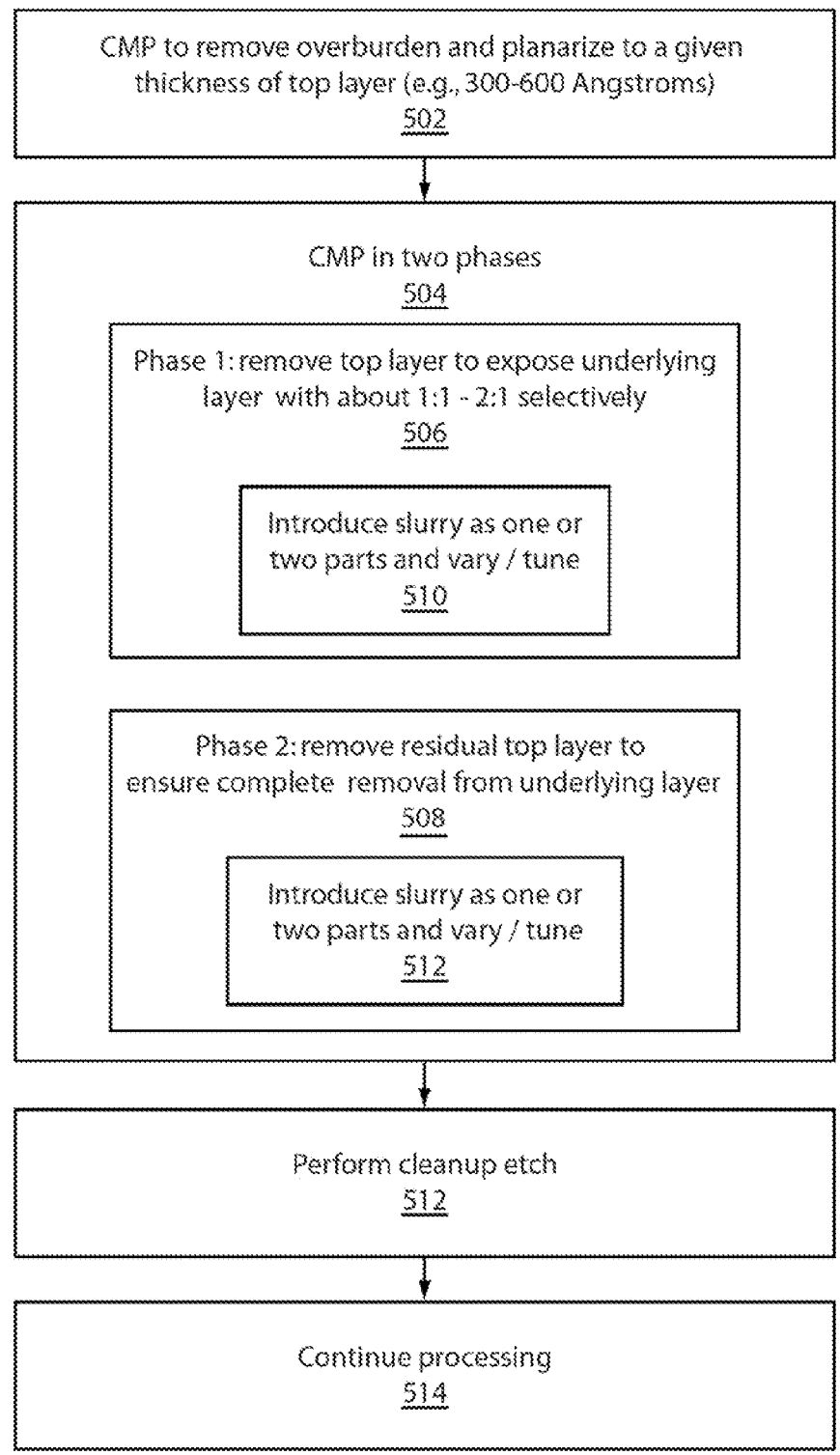
FIG. 4 is a flow chart showing an illustrative method in accordance with the present principles.

Referring to FIG. 4, a method for polishing STI structures with two or more steps to planarize top layers and expose underlying covered areas is provided. In a particularly useful embodiment, the top layer includes an oxide and the underlying layer includes a nitride. However, it should be understood that the present principles include a nitride on top of an oxide or other pairs of materials that may be selectively etched relative to the other. In block 502, chemical mechanical polishing removes any overburden and planarizes an oxide layer leaving 300 to 600 Å of oxide remaining. This polish is accomplished by an oxide slurry containing silica abrasives or slurries containing ceria abrasives and a surfactant. In block 504, a chemical mechanical polish has two phases. In block 506, phase one includes removal of oxide layers and exposing the underlying nitride covered surfaces with oxide to nitride selectivity of ~1:1 to 2:1 to accomplish highly planar topography. In block 508, phase two includes removal of any residual oxide that remains on top of the nitride layers to ensure complete exposure of the nitride surface.

The slurry for phase one (block 506) may include silica abrasives dispersed in aqueous solutions from 0.5 to 30 W %, organic acid in the range of 0.01 to 30 g/L, an acidic pH modulator in the range of 0.01 to 10 g/L, an alkaline pH modulator in the range of 0 to 15 g/L. The pH range of the slurry for phase one (block 506) may be between 1 to 11. A preferred composition of the slurry for phase one (block 506) may include 5 W % of colloidal silica abrasives dispersed in water, 0.5 to 50 g/L of organic acid having two or more carboxylic acid groups, 0.25 to 0.35 g/L of inorganic acid, 0.1 to 1.0 g/L of inorganic base, pH in the range of 2-5, the preferred pH being 4.

The slurry for phase two (block 508) may include a colloidal silica abrasive dispersed in aqueous solution from 0.5 to 30 W %, an organic acid in the range of 0.01 to 30 g/L, an acidic pH modulator in the range of 0.01 to 10 g/L. The pH range of the slurry of phase two (block 508) is preferably 1 to 5. A preferred composition of the slurry for phase two (block 508) includes 5 to 10 W % of colloidal silica abrasives dispersed in water, 5 g/L of organic acid having two or more carboxylic acid groups, 0.25 to 0.35 g/L of inorganic acid, pH in the range of 2-3.

In blocks 510 and 512, the slurries of block 506 and 508 may be introduced in two or more parts and varied to achieve a desired result. In one embodiment, a slurry can be employed as a two part slurry with the following composition: Part 1—0.5 to 30% silica abrasive slurry+0.5 to 50 g/L organic acid+0.01 to 5 g/L acidic pH modulator; and Part 2—0.01 to 5 g/L alkaline pH modulator+0.01 to 50 g/L acidic pH modulator. The slurry can be supplied to the table as two components and allowed to mix on the polishing table to create slurry with the desired final composition. By using the same or different slurry flow rates, slurry composition can be varied during the polish to get desirable polish rates for oxide and nitride at different stages of polish. In another embodiment, the slurry can be used as a two part slurry with the following composition: Part 1—0.5 to 30% silica abrasive slurry+0.5 to 50 g/L organic acid+0.01 to 5 g/L acidic pH modulator, Part 2—0.5 to 30% silica abrasive slurry+0.01 to 5 g/L alkaline pH modulator+0.01 to 50 g/L acidic pH modulator. The slurry can be supplied to the table as two components and allowed to mix on the polishing table to create slurry with the desired final composition. By using the same or different slurry flow rates, slurry composition can be varied during the polish to get desirable polish rates for oxide and nitride at different stages of polish.

In yet another embodiment, the slurry is capable of providing high polish rates for oxide and no significant polish rate for nitride. The composition of such a slurry may include 0.5 to 7 W % of colloidal silica abrasives dispersed in water, 5 g/L of organic acid having two or more carboxylic acid groups, 0.25 to 0.35 g/L of inorganic acid, pH in the range of 2-3. Yet another composition of such a slurry includes 8 to 20 W % of colloidal silica abrasives dispersed in water, 15 g/L of organic acid having two or more carboxylic acid groups, 0.25 to 0.35 g/L of inorganic acid, 0.01 to 5 g/Liter of ammonium hydroxide, pH in the range of 2-5, the preferred pH being ~4. In still another embodiment, the slurry is capable of providing high polish rates for nitride and no significant polish rate for oxide. The composition of such a slurry includes 5 to 10 W % of colloidal silica abrasive, 0.1 to 10 g/L of inorganic acid, pH in the range of 2 to 6.

In block 512, a clean up etch may be performed to remove residual materials. E.g., an HF or hot phosphoric acid wet etch may be performed. In block 514, processing of a semiconductor wafer or die may continue in accordance with a plan of record.

Having described preferred embodiments of systems and methods shallow trench isolation chemical mechanical planarization (CMP) (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A polishing method, comprising:
   polishing, in a first polish, a wafer to remove overburden and planarize a top layer leaving a portion remaining on an underlying layer; and
   polishing, in two phases of a second polish, by:
      in a first phase, removing of the top layer and exposing the underlying layer with a top layer to underlying layer selectivity of between about 1:1 to about 2:1 to provide a planar topography; and
      in a second phase, removing residual portions of the top layer from a top of the underlying layer to ensure complete exposure of an underlying layer surface.

2. The method as recited in claim 1, wherein polishing, in a first polish, includes removing an overburden to reduce the top layer to between about 300 Å to 600 Å.

3. The method as recited in claim 1, wherein, in a first phase, removing of the top layer and exposing the underlying layer includes tuning the selectivity to account for line width, pattern density and feature size on the wafer.

4. The method as recited in claim 1, wherein the top layer includes oxide and the underlying layer includes nitride and the step of, in a first phase, removing of the top layer and exposing the underlying layer includes polishing the oxide and the nitride with a slurry that has polish rates of about 300 to about 600 Å/min.

5. The method as recited in claim 1, wherein the top layer includes oxide and the underlying layer includes nitride and the step of, in a second phase, removing residual portions includes employing a slurry with an oxide polish rate and no significant nitride polish rate.

6. The method as recited in claim 5, wherein the slurry includes:
0.5 to 7 W % of colloidal silica abrasives dispersed in water; 5 g/L of organic acid having two or more carboxylic acid groups; 0.25 to 0.35 g/L of inorganic acid and a pH in the range of 2-3.

7. The method as recited in claim 5, wherein the slurry includes: 8 to 20 W % of colloidal silica abrasives dispersed in water; 15 g/L of organic acid having two or more carboxylic acid groups; 0.25 to 0.35 g/L of inorganic acid; 0.01 to 5 g/Liter of ammonium hydroxide and a pH in the range of 2-5.

8. The method as recited in claim 5, wherein the slurry includes: 5 to 10 W % of colloidal silica abrasive; 0.1 to 10 g/L of inorganic acid and pH in a range of 2 to 6.

9. The method as recited in claim 1, wherein at least one of the two phases of the second polish includes a two component slurry wherein the two components of the slurry are employed for one phase and one component of the slurry is used during the other phase.

10. The method as recited in claim 1, wherein polishing the first phase includes a slurry having silica abrasives dispersed in aqueous solutions with a 0.5 to 30 W %.

11. The method as recited in claim 10, wherein the slurry includes organic acid in the range of 0.01 to 30 g/L.

12. The method as recited in claim 11, wherein the slurry includes an acidic pH modulator in a range of 0.01 to 10 g/L.

13. The method as recited in claim 12, wherein the slurry includes an alkaline pH modulator in a range of 0 to 15 g/L.

14. The method as recited in claim 1, wherein polishing in the first phase includes a slurry having 5 W % of colloidal silica abrasives dispersed in water, 0.5 to 50 g/L of organic acid having two or more carboxylic acid groups, 0.25 to 0.35 g/L of inorganic acid, 0.1 to 1.0 g/L of inorganic base, and pH in a range of 2-5.

15. The method as recited in claim 1, wherein polishing in the second phase includes a slurry having colloidal silica abrasive dispersed in aqueous solution from 0.5 to 30 W %, organic acid in the range of 0.01 to 30 g/L, an acidic pH modulator in a range of 0.01 to 10 g/L, and a pH between 1 to 5.

16. The method as recited in claim 1, wherein polishing in the second phase includes a slurry having 5 to 10 W % of colloidal silica abrasives dispersed in water, 5 g/L of organic acid having two or more carboxylic acid groups, 0.25 to 0.35 g/L of inorganic acid, and pH in a range of 2-3.

17. The method as recited in claim 1, wherein polishing, in two phases of a second polish, includes employing a slurry used as a two part slurry, including:
a part one slurry having a 0.5 to 30 W % silica abrasive slurry, 0.5 to 50 g/L organic acid, and a 0.01 to 5 g/L acidic pH modulator; and
a part two slurry having a 0.01 to 5 g/L alkaline pH modulator, and a 0.01 to 50 g/L acidic pH modulator,
wherein the slurry can be supplied to a polishing table as two components which mix on the polishing table such that flow rates of the part one slurry and the part two slurry are varied to achieve polish rates for the top layer and the underlying layer at different stages of the polishing.

18. The method as recited in claim 1, wherein polishing, in two phases of a second polish, includes employing a slurry used as a two part slurry, including:
a part one slurry having a 0.5 to 30 W % silica abrasive slurry, 0.5 to 50 g/L organic acid, and a 0.01 to 5 g/L acidic pH modulator; and
a part two slurry having a 0.5 to 30% silica abrasive slurry, a 0.01 to 5 g/L alkaline pH modulator and a 0.01 to 50 g/L acidic pH modulator,
wherein the slurry can be supplied to a polishing table as two components which mix on the polishing table such that flow rates of the part one slurry and the part two slurry are varied to achieve polish rates for the top layer and the underlying layer at different stages of the polishing.

19. A method for polishing shallow trench isolation (STI) structures to planarize oxide layers and expose underlying nitride, comprising:
a first chemical mechanical polish step to remove overburden and planarize an oxide layer leaving 300 to 600 Å of oxide remaining;
a second chemical mechanical polish step including two phases having:
a first phase including removing of the oxide layer to expose underlying nitride surfaces with an oxide to nitride selectivity of about 1:1 to 2:1 to provide a planar topography; and
a second phase including removing residual oxide that remains on top of the nitride surface to ensure complete exposure of the nitride surface.

20. The method as recited in claim 19, wherein removing residual oxide includes employing a slurry with an oxide polish rate and no significant nitride polish rate.

21. The method as recited in claim 19, wherein at least one of the first phase and the second phase includes a two component slurry wherein the two components of the slurry are employed for one phase, and one component of the slurry is used during the other phase.

22. The method as recited in claim 19, wherein the first phase includes a slurry having silica abrasives dispersed in aqueous solution with a 0.5 to 30 W %, an organic acid in the range of 0.01 to 30 g/L, an acidic pH modulator in a range of 0.01 to 10 g/L and an alkaline pH modulator in a range of 0 to 15 g/L.

23. The method as recited in claim 19, wherein the first phase includes a slurry used as a two part slurry, including:
a part one slurry having a 0.5 to 30 W % silica abrasive slurry, 0.5 to 50 g/L organic acid, and a 0.01 to 5 g/L acidic pH modulator; and
a part two slurry having a 0.01 to 5 g/L alkaline pH modulator, and a 0.01 to 50 g/L acidic pH modulator,
wherein the slurry can be supplied to a polishing table as two components which mix on the polishing table such that flow rates of the part one slurry and the part two slurry are varied to achieve polish rates for the top layer and the underlying layer at different stages of the polishing.

24. The method as recited in claim 19, wherein the first phase includes a slurry used as a two part slurry, including:
a part one slurry having a 0.5 to 30 W % silica abrasive slurry, 0.5 to 50 g/L organic acid, and a 0.01 to 5 g/L acidic pH modulator; and
a part two slurry having a 0.5 to 30% silica abrasive slurry, a 0.01 to 5 g/L alkaline pH modulator and a 0.01 to 50 g/L acidic pH modulator,
wherein the slurry can be supplied to a polishing table as two components which mix on the polishing table such that flow rates of the part one slurry and the part two slurry are varied to achieve polish rates for the top layer and the underlying layer at different stages of the polishing.

25. The method as recited in claim 19, wherein the first chemical mechanical polish step includes removing an overburden to reduce the oxide layer to between about 300 Å to 600 Å.

* * * * *